(12) United States Patent
Barker et al.

(10) Patent No.: US 11,374,546 B2
(45) Date of Patent: *Jun. 28, 2022

(54) AUTOMATIC VOLUME CONTROL FOR LAND MOBILE RADIO

(71) Applicant: E.F. Johnson Company, Irving, TX (US)

(72) Inventors: Christian K. Barker, Roanoke, TX (US); Joshua Alan Johnson, Lincoln, NE (US); Stephen Joseph Borer, Lincoln, NE (US); Marshall Pommier Schiring, Lincoln, NE (US)

(73) Assignee: E.F. Johnson Company, Irving, TX (US)

( * ) Notice: Subject to any disclaimer, the term of this patent is extended or adjusted under 35 U.S.C. 154(b) by 8 days.

This patent is subject to a terminal disclaimer.

(21) Appl. No.: 16/664,472

(22) Filed: Oct. 25, 2019

(65) Prior Publication Data

US 2020/0067474 A1 Feb. 27, 2020

Related U.S. Application Data

(63) Continuation of application No. 15/923,694, filed on Mar. 16, 2018, now Pat. No. 10,469,047, which is a
(Continued)

(51) Int. Cl.
*H03G 3/32* (2006.01)
*B64D 45/00* (2006.01)
(Continued)

(52) U.S. Cl.
CPC .......... *H03G 3/32* (2013.01); *B64D 45/0059* (2019.08); *H03G 3/00* (2013.01); *H03G 3/20* (2013.01);
(Continued)

(58) Field of Classification Search
CPC .......... H03G 3/32; H03G 3/001; H03G 3/20; H03G 3/00; H03G 3/24; H03G 5/165;
(Continued)

(56) References Cited

U.S. PATENT DOCUMENTS 4,247,955 A 1/1981 Wiedemann
4,254,303 A 3/1981 Takizawa
(Continued)

FOREIGN PATENT DOCUMENTS

JP 04352299 12/1992
JP 05315987 11/1993
(Continued)

*Primary Examiner* — Matthew A Eason
*Assistant Examiner* — Kuassi A Ganmavo
(74) *Attorney, Agent, or Firm* — Foley & Lardner LLP

(57) ABSTRACT

The present disclosure provides a radio and method for automatically adjusting, in response to ambient noise, the volume setting of a radio. The radio comprises a microphone for receiving ambient audio and generating a microphone signal; a codec for receiving the microphone signal and generating a processor signal representative of the ambient audio; and processor circuitry operable to receive the processor signal, determine an ambient audio level in response to the processor signal, and determine an adjusted radio volume to generate a radio volume control signal, wherein the adjusted radio volume is determined by calculating a difference between a baseline volume level and ambient audio level and adding a current volume level setting, wherein the codec is also operable to receive the radio volume control signal and generate an output signal to adjust the radio volume setting to maintain a net difference between the adjusted radio volume and ambient audio.

20 Claims, 7 Drawing Sheets

Related U.S. Application Data continuation of application No. 14/815,033, filed on Jul. 31, 2015, now Pat. No. 9,923,534.

(60) Provisional application No. 62/031,785, filed on Jul. 31, 2014.

(51) Int. Cl.

| | | |
|---|---|---|
| *H03G 3/20* | (2006.01) | |
| *H03G 3/00* | (2006.01) | |
| *H03G 5/16* | (2006.01) | |
| *H03G 3/24* | (2006.01) | |
| *H04B 1/44* | (2006.01) | |
| *H04M 1/60* | (2006.01) | |

(52) U.S. Cl.
CPC .............. *H03G 3/24* (2013.01); *H03G 5/16* (2013.01); *H03G 5/165* (2013.01); *H04B 1/44* (2013.01); *H04M 1/6016* (2013.01)

(58) Field of Classification Search
CPC ............ G10L 21/0364; H04M 1/6016; B64D 45/0059; H04B 1/44; H04W 4/10; H04W 4/06
See application file for complete search history.

(56) References Cited

U.S. PATENT DOCUMENTS

| | | | |
|---|---|---|---|
| 4,553,257 A | 11/1985 | Mori et al. | |
| 4,677,389 A | 6/1987 | Op De Beek et al. | |
| 5,027,432 A | 6/1991 | Skala et al. | |
| 5,093,658 A | 3/1992 | Grothause | |
| 5,297,198 A | 3/1994 | Butani et al. | |
| 5,483,600 A | 1/1996 | Werrbach | |
| 5,506,578 A * | 4/1996 | Kishi | B60R 16/0373 340/692 |
| 5,666,426 A | 9/1997 | Helms | |
| 5,771,297 A | 6/1998 | Richardson | |
| 5,774,673 A | 6/1998 | Beuk et al. | |
| 6,298,247 B1 * | 10/2001 | Alperovich | H04M 1/6008 455/355 |
| 6,381,224 B1 | 4/2002 | Lane et al. | |
| 6,483,600 B1 | 11/2002 | Schuster et al. | |
| 6,584,201 B1 | 6/2003 | Konstantinou et al. | |
| 6,766,176 B1 | 7/2004 | Gupta et al. | |
| 6,775,337 B2 | 8/2004 | Janky et al. | |
| 6,873,837 B1 | 3/2005 | Yoshioka et al. | |
| 7,567,165 B2 | 7/2009 | Epley | |
| 7,636,444 B2 | 12/2009 | Cronin | |
| 7,733,224 B2 * | 6/2010 | Tran | A61B 5/0006 340/8.1 |
| 7,869,768 B1 * | 1/2011 | Vishlitzky | H04M 1/6016 455/67.13 |
| 8,170,221 B2 | 5/2012 | Christoph | |
| 8,571,855 B2 | 10/2013 | Christoph | |
| 8,630,427 B2 | 1/2014 | Avayu et al. | |
| 9,923,534 B2 | 3/2018 | Barker et al. | |
| 10,469,047 B2 | 11/2019 | Barker et al. | |
| 2003/0013495 A1 | 1/2003 | Oleksy | |
| 2003/0179887 A1 | 9/2003 | Cronin | |
| 2005/0059369 A1 * | 3/2005 | Sapashe | H03G 3/32 455/177.1 |
| 2005/0063552 A1 * | 3/2005 | Shuttleworth | H04R 29/00 381/57 |
| 2005/0213746 A1 | 9/2005 | Doss et al. | |
| 2005/0232439 A1 | 10/2005 | Enomoto et al. | |
| 2005/0250553 A1 * | 11/2005 | Lim | H04M 1/605 455/569.1 |
| 2006/0183466 A1 | 8/2006 | Lee et al. | |
| 2007/0053528 A1 | 3/2007 | Kim et al. | |
| 2008/0085007 A1 | 4/2008 | Engelbrecht et al. | |
| 2009/0098836 A1 * | 4/2009 | Yurman | H04B 1/46 455/90.2 |
| 2009/0191822 A1 | 7/2009 | Chen et al. | |
| 2010/0329471 A1 | 12/2010 | Dunn et al. | |
| 2011/0035032 A1 * | 2/2011 | Wu | H03G 3/32 700/94 |
| 2011/0135086 A1 | 6/2011 | Sun et al. | |
| 2011/0299705 A1 * | 12/2011 | Chen | H03G 3/32 381/107 |
| 2011/0305346 A1 | 12/2011 | Daubigny | |
| 2012/0057725 A1 | 3/2012 | Nakamura | |
| 2012/0201393 A1 | 8/2012 | Cheek et al. | |
| 2012/0259441 A1 * | 10/2012 | Armstrong | H03G 3/10 700/94 |
| 2014/0057574 A1 * | 2/2014 | Tealdi | H04B 1/44 455/69 |
| 2014/0337018 A1 | 11/2014 | Samuel et al. | |
| 2015/0016633 A1 * | 1/2015 | Gao | H03G 3/32 381/107 |
| 2015/0038122 A1 | 2/2015 | Akizuki et al. | |
| 2015/0282669 A1 | 10/2015 | Contarino, Jr. | |
| 2016/0087597 A1 | 3/2016 | Barker et al. | |
| 2016/0269877 A1 | 9/2016 | Tang et al. | |
| 2018/0205354 A1 | 7/2018 | Barker et al. | |

FOREIGN PATENT DOCUMENTS

| | | | |
|---|---|---|---|
| JP | 2000236280 | | 8/2000 |
| JP | 2010130301 A | * | 6/2010 |
| KR | 20060114914 A | * | 11/2006 |
| WO | WO-2015024434 A1 | * | 2/2015 ............... H03G 3/32 |

\* cited by examiner

AUTOMATIC VOLUME CONTROL FOR LAND MOBILE RADIO

CROSS-REFERENCE TO RELATED APPLICATIONS

Pursuant to 35 U.S.C. § 119(e), this application is a continuation of U.S. patent application Ser. No. 15/923,694, entitled "AUTOMATIC VOLUME CONTROL FOR LAND MOBILE RADIO," filed Mar. 16, 2018, and naming Christian K. Barker, Joshua Alan Johnson, Stephen Joseph Borer, and Marshall Pommier Schiring as inventors, which is a continuation of U.S. Pat. No. 9,923,534, entitled "AUTOMATIC VOLUME CONTROL FOR LAND MOBILE RADIO," filed Jul. 31, 2015, and naming Christian K. Barker, Joshua Alan Johnson, Stephen Joseph Borer, and Marshall Pommier Schiring as inventors, which is a non-provisional of U.S. Provisional Patent Application Ser. No. 62/031,785, entitled "AUTOMATIC VOLUME CONTROL FOR LAND MOBILE RADIO," filed Jul. 31, 2014, and naming Christian K. Barker, Joshua Alan Johnson, Stephen Joseph Borer, and Marshall Pommier Schiring as inventors, the disclosures of which are incorporated herein by reference in their entirety.

FIELD

The present disclosure relates generally to communication systems. More specifically, but not by way of limitation, the present disclosure relates to an apparatus and method for automatically adjusting the volume setting of a radio in a Land Mobile Radio (LMR) communication system.

BACKGROUND

The statements in this section merely provide background information related to the present disclosure and may not constitute prior art.

Land Mobile Radio (LMR) systems are deployed by organizations requiring instant communication between geographically dispersed and mobile personnel. Current LMR systems can be configured to provide for radio communications between one or more sites and subscriber radio units in the field. A subscriber radio unit (hereinafter "radio") may be a mobile unit or a portable unit. LMR systems can be as simple as two radio units communicating between themselves over preset channels, or they can be complex systems that include hundreds of radio units and multiple sites. Typical users of LMR systems include police departments, fire departments, medical personnel, security personnel, EMS, and the military.

Radios deployed in LMR systems may face various difficulties depending upon their use, environment, and other circumstances, thereby compromising communication in certain situations. For example, firefighters often work in high, unpredictable noise environments where the volume of the ambient noise changes unpredictably due to various factors, such as changes in the environment. Therefore, a firefighter may need to constantly adjust the volume setting of his portable radio in response to the variations of the ambient noise. However, when a firefighter is fully equipped at a fire scene, his radio is usually inaccessible. For example, the radio may be worn in a location that is inconvenient to access, or the firefighter has limited use of his hands because he is wearing gloves or using tools. As such, the firefighter is unable to conveniently control the volume setting of his portable radio.

SUMMARY

In one embodiment, the present disclosure provides a land mobile radio for use in a land mobile radio (LMR) system, the land mobile radio configured to automatically adjust a volume setting of the land mobile radio in response to ambient audio, the land mobile radio comprising: a first microphone configured to receive the ambient audio and generate a microphone signal in response to receiving the ambient audio; an analog-to-digital converter configured to receive the microphone signal and generate a processor input signal representative of the ambient audio; first circuitry configured to receive the processor input signal, determine an ambient audio level in response to the processor input signal, and determine an adjusted radio volume to generate a radio volume control signal, wherein the adjusted radio volume is determined by calculating a difference between a baseline volume level and the ambient audio level and adding a current volume level setting; and a digital-to-analog converter configured to receive the radio volume control signal and generate an output signal to adjust the volume setting of the land mobile radio such that a net difference is maintained between the adjusted radio volume and the ambient audio.

In another embodiment, the present disclosure provides a method for automatically adjusting a volume setting of a land mobile radio in response to ambient audio, the method comprising: receiving the ambient audio at a microphone of the radio and generating a microphone signal; receiving the microphone signal at an analog-to-digital converter and generating a processor input signal representative of the ambient audio received at the microphone; receiving the processor input signal at first processor circuitry and determining an ambient audio level; determining an adjusted radio volume by calculating a difference between a baseline volume level and the ambient audio level and adding a current volume level setting; generating a radio volume control signal based on the adjusted radio volume; and receiving the radio volume control signal and adjusting the volume setting of the land mobile radio such that a net difference is maintained between the adjusted radio volume and the ambient audio.

In yet another embodiment, the present disclosure provides one or more storage media embodied with computer-executable instructions that, when executed by a processor, perform a method for automatically adjusting a volume setting of a land mobile radio in response to ambient audio, the method comprising: receiving the ambient audio at a microphone of the radio and generating a microphone signal; receiving the microphone signal at an analog-to-digital converter and generating a processor input signal representative of the ambient audio received at the microphone; receiving the processor input signal at first processor circuitry and determining an ambient audio level; determining an adjusted radio volume by calculating a difference between a baseline volume level and the ambient audio level and adding a current volume level setting; generating a radio volume control signal based on the adjusted radio volume; and receiving the radio volume control signal and adjusting the volume setting of the land mobile radio such that a net difference is maintained between the adjusted radio volume and the ambient audio.

Further embodiments and apparatuses, including other areas of applicability, will become apparent from the description provided herein. It should be understood that the description and specific examples are intended for purposes of illustration only and are not intended to limit the scope of the present disclosure in any manner.

BRIEF DESCRIPTION OF THE DRAWINGS

For a more complete understanding of various embodiments of the present invention and the advantages thereof, reference is now made to the following brief description, taken in connection with the accompanying drawings and detailed description, wherein like reference numerals represent like parts, and in which.

DETAILED DESCRIPTION OF THE FIGURES

In the following detailed description and the attached drawings, numerous specific details are set forth to provide a thorough understanding of the present disclosure. However, those skilled in the art will appreciate that the present disclosure may be practiced, in some instances, without such specific details. In other instances, well-known elements have been illustrated in schematic or block diagram form in order not to obscure the present disclosure in unnecessary detail. Additionally, for the most part, specific details, and the like, have been omitted inasmuch as such details are not considered necessary to obtain a complete understanding of the present disclosure, and are considered to be within the understanding of persons of ordinary skill in the relevant art.

It is further noted that, unless indicated otherwise, all functions described herein may be performed in hardware or as software instructions for enabling a computer, radio or other device to perform predetermined operations, where the software instructions are embodied on a computer readable storage medium, such as RAM, a hard drive, flash memory or other type of computer readable storage medium known to a person of ordinary skill in the art. In certain embodiments, the predetermined operations of the computer, radio or other device are performed by a processor such as a computer or an electronic data processor in accordance with code such as computer program code, software, firmware, and, in some embodiments, integrated circuitry that is coded to perform such functions. Furthermore, it should be understood that various operations described herein as being performed by a user may be operations manually performed by the user, or may be automated processes performed either with or without instruction provided by the user.

Figure 1:
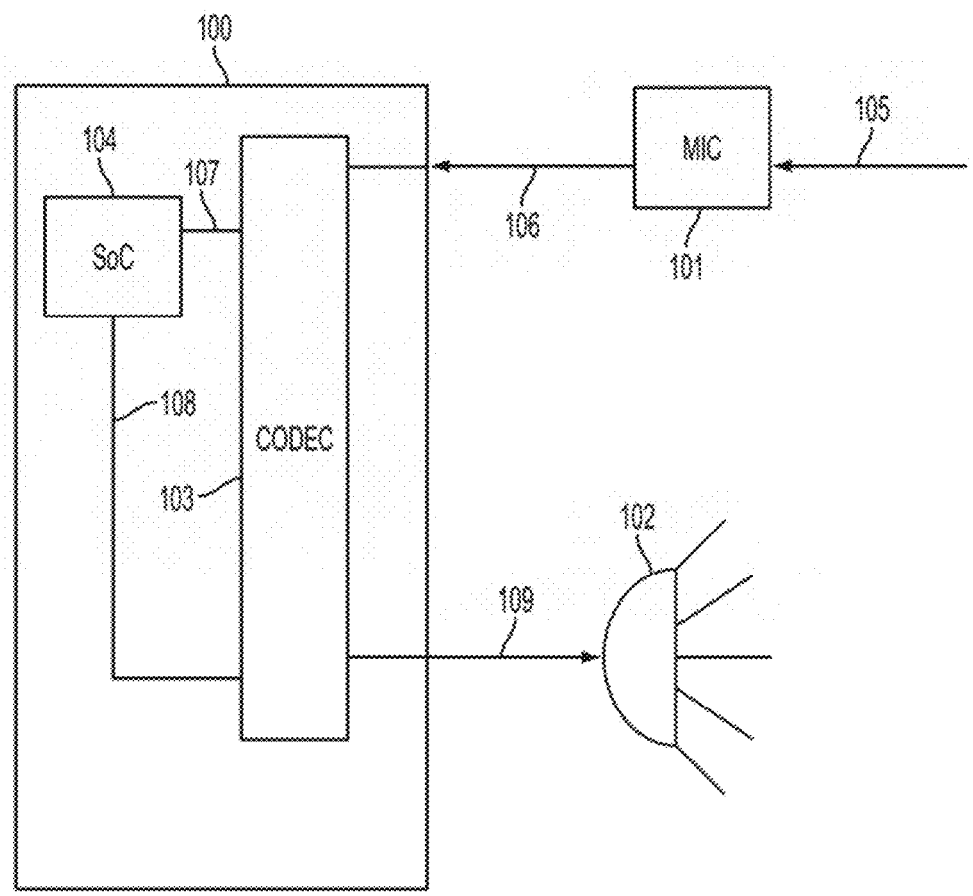
FIG. 1 illustrates a block diagram of various components comprising a land mobile radio in accordance with an embodiment of the present disclosure.

The present disclosure provides a radio and method for automatically and continuously adjusting, in response to ambient noise, the volume setting of a radio for use in a Land Mobile Radio (LMR) system. FIG. 1 illustrates an example embodiment of circuitry components comprising a radio 100, including a microphone 101 coupled to the radio 100 and a radio speaker 102. As shown in FIG. 1, the radio 100 includes a codec 103 and processor circuitry 104, which may be implemented, in some embodiments, as a system on a chip (SoC). It should be appreciated that the radio components may be fully integrated with the radio unit itself or discrete components separate from, but connected or coupled to, the radio unit. For example, in some embodiments, the microphone 101 may be a microphone physically located on the radio unit. In other embodiments, the microphone 101 may be coupled to the radio as a shoulder microphone or other external microphone separate from, but coupled via wired or wireless connection to, the radio unit 100. In some embodiments, the microphone 101 and speaker 102 may be integrated as a single unit. In some embodiments, the speaker 102 may be a speaker physically located on the radio unit. In other embodiments, the speaker 102 may be an external speaker separate from, but coupled via wired or wireless connection to, the radio unit 100.

The circuitry illustrated in FIG. 1 is now described with reference to an embodiment of a method for automatically adjusting the volume setting of a radio in response to ambient audio received at the radio. The method is illustrated by the flow diagram of FIG. 2. In accordance with the embodiment of the method illustrated in FIG. 2, at 200, the processor circuitry 104 determines whether the radio is operating in a transmit state or if the speaker 102 is activated. If either of these conditions are true, then the method is paused until both conditions are false, before moving to the next block. In some embodiments, the determination in block 200 may be performed continuously as the radio operates, and not just as a single occurrence in sequential order with other blocks in the method. In some embodiments, the volume may be adjusted every second. In some embodiments, the automatic volume control feature may be paused when a user is activating radio buttons or performing other such operations.

Figure 2:
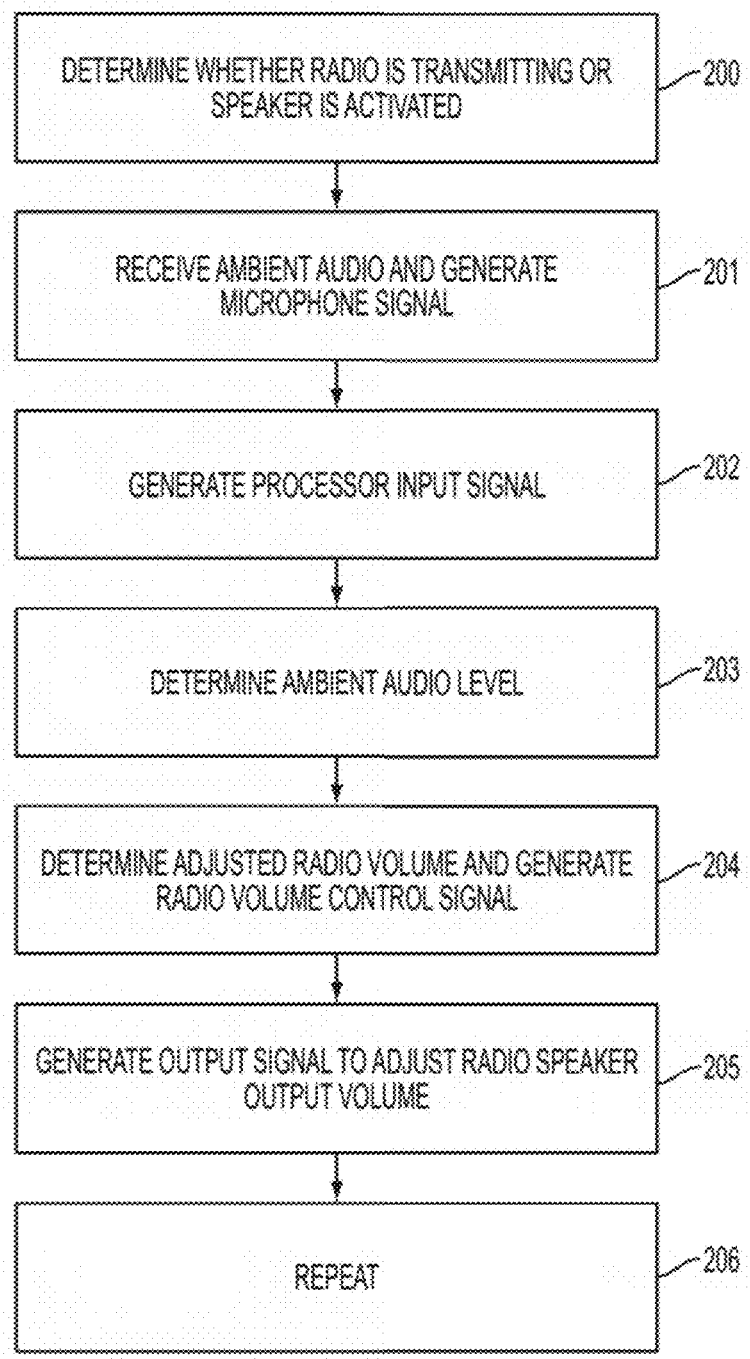
FIG. 2 illustrates a flow diagram of an embodiment of a method for automatically adjusting the volume setting of a radio in response to ambient audio received at the radio.

In accordance with the embodiment illustrated in FIG. 1, and at block 201 of FIG. 2, the radio microphone 101 receives the ambient audio 105 and generates a microphone signal 106, wherein the microphone signal 106 is typically an analog signal representative of the ambient audio received at the microphone 101. At block 202, the codec 103 receives the microphone signal 106 and generates a processor input signal 107 that is representative of the ambient audio received at the radio microphone 101. In some embodiments, the codec 103 comprises analog-to-digital converter circuitry, and the microphone signal 106 is converted to a digital signal, which is produced by the codec 103 as the processor input signal 107.

At block 203, the processor input signal 107 is received by the processor circuitry 104, and the processor circuitry 104 determines an ambient audio level, which is a value that is representative of a volume level of the ambient audio received at the microphone 101. This process is discussed in greater detail below.

At block 204, the processor circuitry 104 determines an adjusted radio volume and generates a radio volume control signal 108. In some embodiments, the adjusted radio volume is calculated by subtracting a baseline volume level from the ambient audio level, and then adding a current volume level setting. As explained in greater detail below, the baseline volume level is a value that represents a volume level for use in a quiet environment (i.e., an environment with little or no ambient audio). The current volume level setting is a value that is representative of the current radio speaker volume setting.

Figure 3:
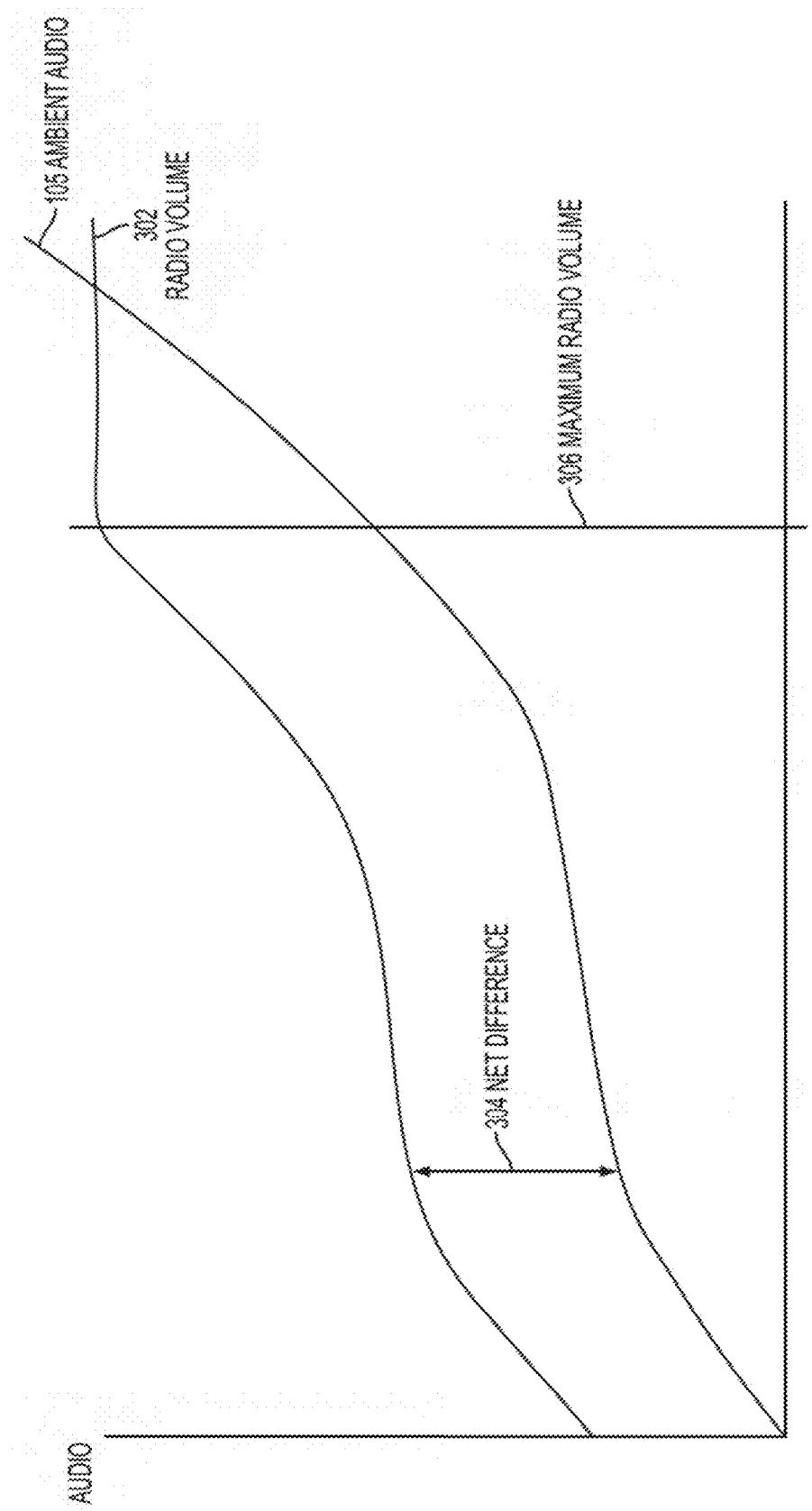
FIG. 3 presents a graph illustrating a comparison of ambient audio and radio volume adjusted in accordance with an embodiment of the present disclosure.

Reference is made now to FIG. 3, which presents a graph illustrating the ambient audio 105 and the radio volume 302 (this is not the current radio volume level setting, but rather, the adjusted volume of the radio), which is adjusted in accordance with the present disclosure to maintain a volume level greater than the ambient audio 105 (i.e., net difference 304). The adjusted radio volume (element 615 discussed below with reference to FIGS. 6 and 7) determined by the processor circuitry 104 is a value that indicates a desired radio speaker volume (radio volume 304) to be achieved in response to fluctuations in the volume of the ambient audio 105. In other words, the adjusted radio volume (element 615 below) represents a desired radio volume, the value of which is calculated to maintain, in real-time, a net difference 304 between the ambient audio 105 and the volume of the radio 302 (which is manifested as the output volume of the radio speaker 102). In some embodiments, the net difference 304 is equal to the difference between the ambient audio level and the baseline volume level.

In some embodiments, the radio may have a maximum volume level 306, which sets a maximum value for the radio volume 302. In accordance with such embodiments, when the radio volume 302 reaches the maximum volume level 306, the net difference 304 may not be maintained as the ambient audio 105 continues to increase.

The radio volume control signal 108 is the control signal produced by the processor circuitry 104 to ultimately instruct the radio to adjust the radio volume setting (pursuant to the adjusted radio volume value discussed above) in real-time so that the radio volume 302 is adjusted to maintain a volume greater than the ambient audio 105, wherein the desired difference between the radio volume 302 and ambient audio 105 is the net difference 304 (i.e., the difference between the ambient audio level and the baseline volume level). Thus, as the ambient audio 105 increases, the adjusted radio volume (615 below) increases, and the radio volume control signal 108 instructs the radio to increase the radio volume setting to maintain the net difference 304 between the ambient audio 105 and the volume of the radio 302. Conversely, as the ambient audio 105 decreases, the adjusted radio volume (615 below) decreases, and the radio volume control signal 108 instructs the radio to decrease the radio volume setting to maintain the net difference 304 between the ambient audio 105 and the volume of the radio 302.

At block 205, the codec 103 receives the radio volume control signal 108, and adjusts output signal 109 to control the output volume of the radio speaker 102 in response to the radio volume control signal 108, such that the volume of the output speaker 102 is adjusted to maintain a volume greater than the ambient audio 105, wherein the desired difference between the volume of the output speaker 102 and ambient audio 105 is the net difference 304 (i.e., the difference between the ambient audio level and the baseline volume level). Thus, as the ambient audio 105 increases, the radio volume setting is increased, and the output signal 109 controls the speaker 102 to increase the output volume of the speaker to maintain the net difference 304 between the ambient audio 105 and the volume of the speaker 102. Conversely, as the ambient audio 105 decreases, the radio volume setting is decreased, and the output signal 109 controls the speaker 102 to decrease the output volume of the speaker to maintain the net difference 304 between the ambient audio 105 and the volume of the speaker 102.

At block 206, the process is repeated so that the volume of the radio speaker 102 is continuously adjusted in response to the ambient audio received at the radio microphone 101.

Figure 4:
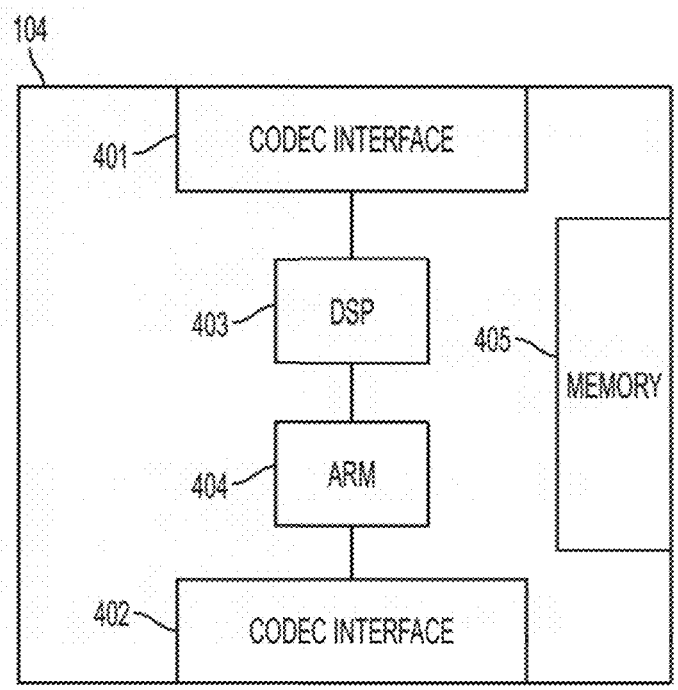
FIG. 4 illustrates a block diagram of processor circuitry in accordance with an example embodiment of the present disclosure.

Reference is now made to FIGS. 4-7, which illustrate example embodiments of various circuitry components for performing the disclosed method for automatically adjusting a volume setting of a land mobile radio in response to ambient audio. Referring first to FIG. 4, there is illustrated a block diagram of the processor circuitry/SoC 104 illustrated in FIG. 1. The processor circuitry 104 includes, in some embodiments, codec interfaces 401 and 402, a digital signal processor (DSP) 403, ARM processor 404, and other components such as, for example, memory 405. It should be appreciated that additional circuitry may comprise the various components described herein and illustrated in the accompanying figures. Furthermore, it should be appreciated that various components described herein may be substituted with other circuitry or components capable of fulfilling similar processes or purposes.

Figure 5:
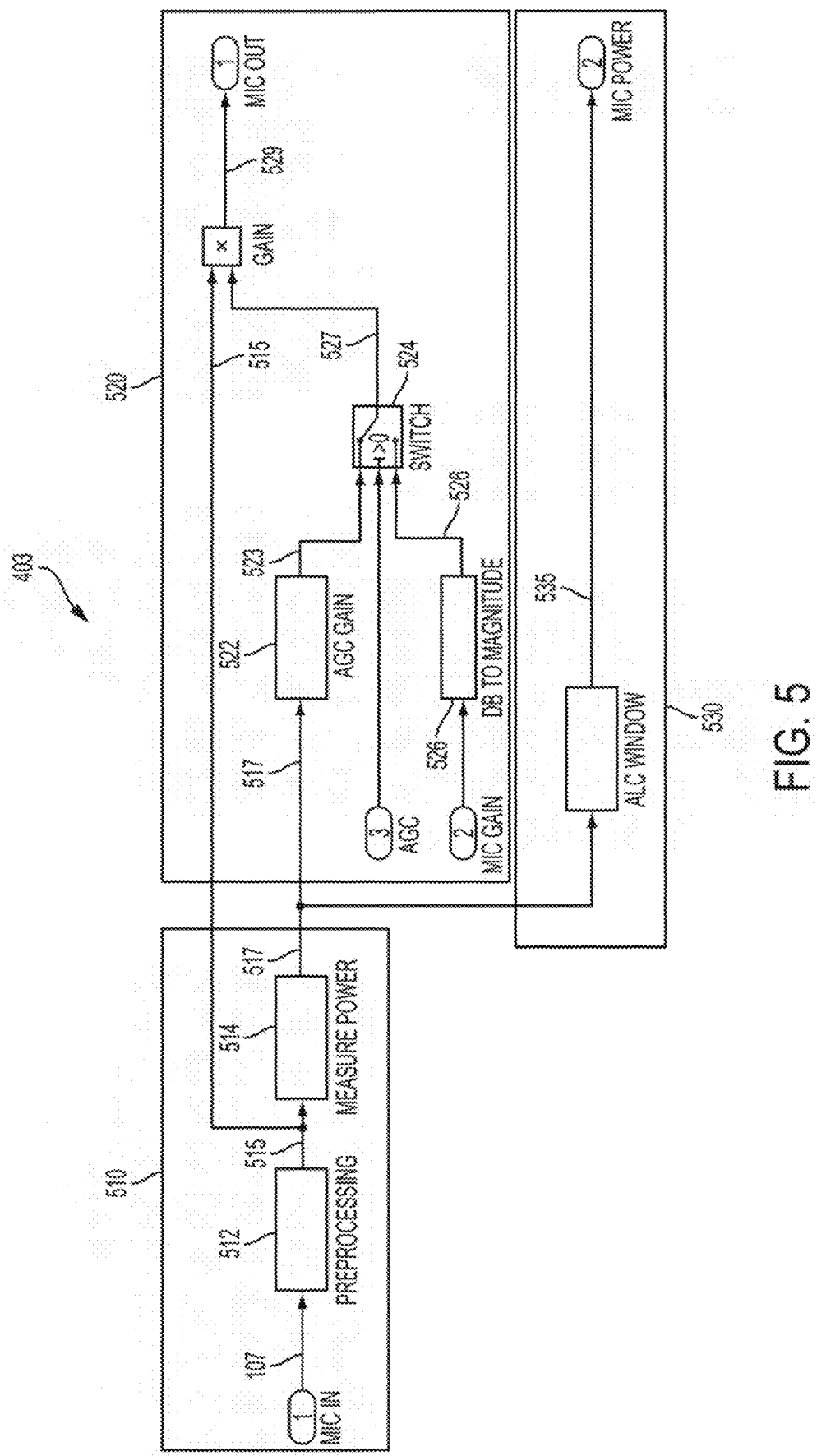
FIG. 5 illustrates an example block diagram of the DSP comprising the processor circuitry shown in FIG. 1.

FIG. 5 illustrates an example block diagram of the DSP 403 comprising the processor circuitry 104. In the embodiment illustrated in FIG. 5, the DSP 403 includes initialization circuitry 510, automatic gain control (AGC) circuitry 520, and level control circuitry 530. The initialization circuitry 510 includes preprocessing circuitry 512 and power measurement circuitry 514. The preprocessing circuitry 512 receives the processor input signal 107 from the codec 103, and cleans the signal 107 by changing the sample rate and removing any microphone bias. The cleaned audio signal 515 is then passed to the power measurement circuitry 514, which measures the average power of the cleaned audio signal 515 over a window (e.g., 5 msec) to determine how much audio is present in the signal. An average power measurement 517 is output by the power measurement circuitry 514.

The average power measurement 517 is then passed to the level control circuitry 530, which averages the average power measurement 517 over a window (e.g., 1 sec.) to convert the average power measurement 517 to a longer power average (e.g., 1 sec.) expressed in a dB scale. The output of the level control circuitry 530 is the ambient audio level 535, which is a value that is representative of a volume level of the ambient audio received at the microphone 101.

In some embodiments, the processor circuitry 104 may include an automatic gain control function, wherein the audio received at the microphone 101 is amplified for transmission. As such, the received audio is presumed to be voice audio for this purpose (rather than ambient audio). In the embodiment illustrated in FIG. 5, the automatic gain control function is performed by the AGC circuitry 520. The AGC circuitry 520 includes gain control circuitry 522, which receives the average power measurement 517, and averages a number of average power measurement 517 samples over a period of time to produce a longer power average. For example, in some embodiments, the measurement 517 may be averaged over a period of twenty samples (100 msec.) to produce the longer power average. The longer power average is then compared to a desired power level (typically represented as a constant). Thus the output of the gain control circuitry 522 is a ratio 523 of the longer power average to a desired power average. The ratio 523 is then fed into a switch box 524.

The AGC circuitry 520 also includes circuitry 526 for receiving a dB gain level of the microphone and converting it to a linear gain level 525. In some embodiments, the dB gain level may be a fixed value. In some embodiments, the dB gain level may be programmable. The switch box 524 then selects as its output the AGC ratio 523 if the AGC function is enabled, or the linear gain level 525 if the AGC function is disabled. The switch box output 527 is then multiplied with the cleaned audio signal 515 to produce the amplified audio signal 529. It should be appreciated that, in some embodiments, the signal 529 may be reduced instead of amplified.

Figure 6:
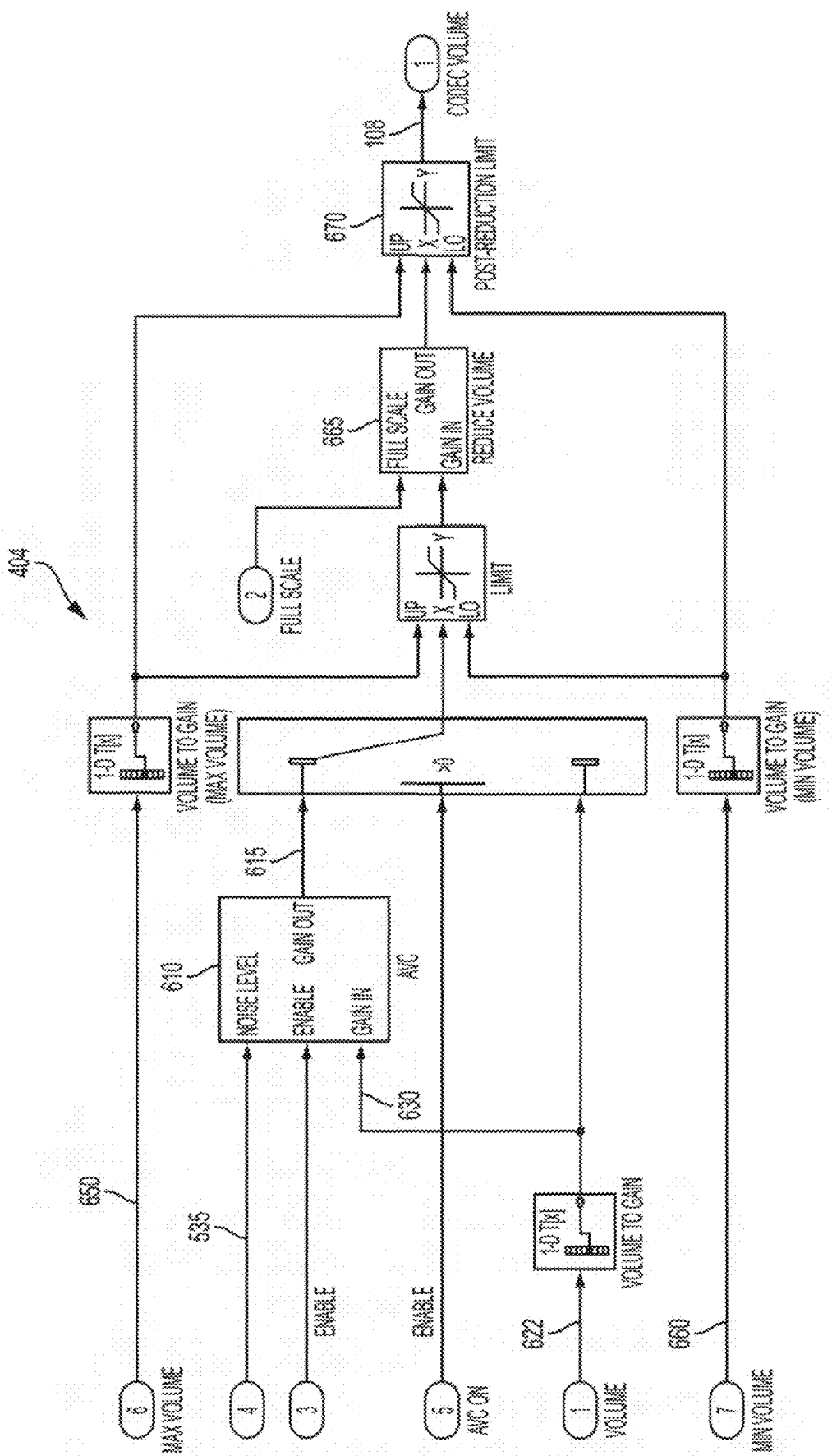
FIG. 6 illustrates an example block diagram of the ARM processor comprising the processor circuitry shown in FIG. 1.

FIG. 6 illustrates an example block diagram of the ARM processor 404 comprising the processor circuitry 104. In the embodiment illustrated in FIG. 6, the ARM processor 404 includes automatic volume control circuitry 610, which receives the ambient audio level 535 from the DSP circuitry 403 and determines the adjusted radio volume 615. The ARM processor 404 also receives the current volume setting 622, which is converted to dB scale and passed to the automatic volume control circuitry 610 as current volume setting 630.

Figure 7:
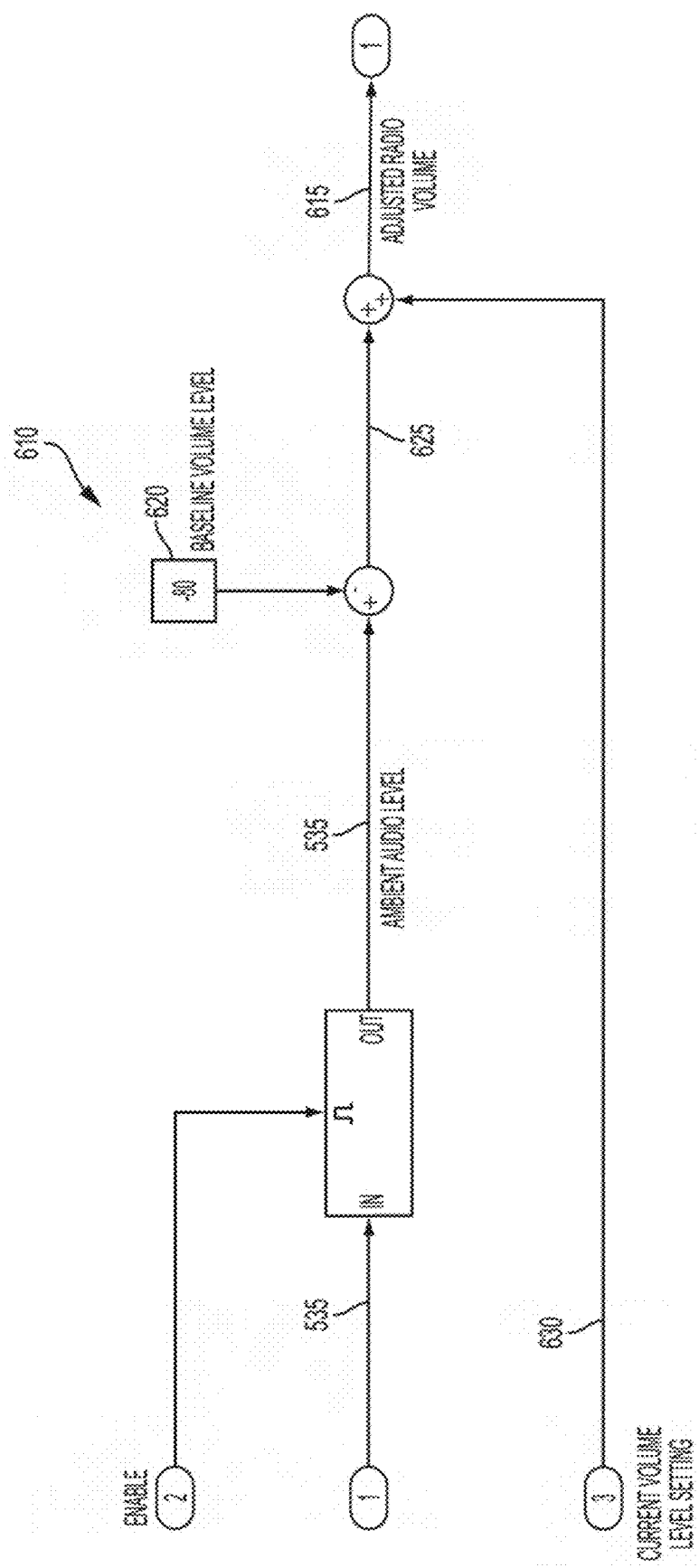
FIG. 7 illustrates an example block diagram illustrating an example embodiment of the automatic volume control circuitry shown in FIG. 6.

FIG. 7 illustrates an example block diagram illustrating an example embodiment of the automatic volume control circuitry 610 shown in FIG. 6. In the embodiment illustrated in FIG. 7, the automatic volume control circuitry 610 receives the ambient audio level 535, and subtracts from the ambient audio level 535 a baseline volume level 620, to produce a value 625, wherein the value 625 is the difference between the baseline volume level 620 and the ambient audio level 535. The value 625 is equivalent to the net difference 304 illustrated in FIG. 3 and discussed above. Next, the current volume level setting 630 is added to the value 625 to produce the adjusted radio volume 615, which represents a desired radio volume setting responsive to the ambient audio received at the radio microphone 101.

As discussed above, the current volume level setting is a value that is representative of the current radio volume setting, and the baseline volume level is a value that represents a volume level for use in a quiet environment. In some embodiments, the baseline volume level may be set manually by a user adjusting the radio volume knob to the desired volume setting. In other embodiments, the baseline volume level may be programmed into the radio as a preset value. In some embodiments, a user may adjust the baseline volume level, even if the baseline volume level is programmed as a preset value.

Referring again to FIG. 6, the ARM processor 404 further includes, in some embodiments, an upper volume limit 650 and lower volume limit 660, which are both converted to dB scale and may be used to set upper and lower volume limits to limit saturation of the adjusted radio volume 615. In some embodiments, the ARM processor 404 may also include volume reduction circuitry 665 to reduce the adjusted radio volume 615 in accordance with certain specifications. Additional reduction/limiter circuitry 670 may also be incorporated to ensure the adjusted radio volume 615 is within the volume limits. The ARM processor 404 then outputs the radio volume control signal 108, which is output to the codec 103 via the codec interface 402.

A number of additional and alternative embodiments of the disclosed system and method may be provided without departing from the spirit or scope of the present disclosure as set forth in the claims provided herein. These various embodiments are believed to be understood by one of ordinary skill in the art in view of the present disclosure. For example, in some embodiments, the disclosed automatic volume control feature may be enabled or disabled by a radio menu or radio button. In some embodiments, the radio may include multiple microphones. In such embodiments, one microphone may be set to operate primarily for ambient audio reception, and the other for voice audio. Additionally, multiple microphone embodiments may use an average of the audio signals generated by the multiple microphones, or may use the highest of the audio signals.

In some embodiments, multiple microphones may be used such that one microphone samples the volume at the radio unit (or next to the radio speaker) during a call to sample the received call volume. A separate microphone may then be used to sample the ambient audio, which may be compared with the received call volume. The disclosed feature may then be used to adjust the radio volume in response to the ambient audio. Thus, if an incoming call is too quiet or loud, the speaker volume may be adjusted accordingly.

What is claimed is:

1. A land mobile radio for use in a land mobile radio (LMR) system, the land mobile radio configured to adjust a current volume level setting of the LMR in response to ambient audio, the LMR comprising:
a first circuitry configured to receive a processor input signal based on the ambient audio and, in response to receiving the processor input signal based on the ambient audio, calculate a first amplitude difference between the ambient audio and the current volume level setting,
wherein the first circuitry is configured to provide an upper volume limit and a lower volume limit,
wherein the first circuitry is configured to adjust the current volume level setting to maintain the current volume level setting within the upper volume limit and the lower volume limit,
wherein the first circuitry is further configured to set the current volume level setting of the LMR such that (i) the first amplitude difference is maintained between the current volume level setting and the ambient audio as the ambient audio changes in amplitude, and (ii) the current volume level setting is maintained within the upper volume limit and the lower volume limit, and
wherein the first circuitry is configured to not change the current volume level setting of the land mobile radio when the LMR is operating in a transmit state.

2. The land mobile radio of claim 1, wherein the current volume level setting is not set in response to an activating by a user of a radio button on the LMR and is resumed to being set in response to a completing of the activating.

3. The land mobile radio of claim 1, wherein the difference maintained between the current volume level setting and the ambient audio is user adjustable.

4. The land mobile radio of claim 1, wherein the difference between an output volume of a radio speaker and the ambient audio is preset.

5. The land mobile radio of claim 1, further comprising:
a radio speaker configured to produce output audio at an output volume based on the current volume level setting of the LMR;
a first microphone configured to receive the ambient audio and generate a microphone signal in response to receiving the ambient audio; and
an analog-to-digital converter configured to receive the microphone signal and generate the processor input signal based on the ambient audio.

6. The land mobile radio of claim 5, wherein the analog-to-digital converter comprises a codec.

7. The land mobile radio of claim 1, wherein the first circuitry comprises a first processor configured to determine the difference.

8. The land mobile radio of claim 1, wherein the first circuitry is further configured to produce an amplification signal representative of an amplification of the ambient audio.

9. A method for setting a current volume level setting of a land mobile radio in response to ambient audio, the method comprising:
- receiving a processor input signal based on an ambient audio at a first processor circuitry and determining an ambient audio level based on the ambient audio;
- setting a value of the current volume level setting of the land mobile radio such that a difference is maintained between the current volume level setting and the ambient audio level as the ambient audio changes in amplitude,
- wherein the setting the value of the current volume level setting further comprises providing an upper volume limit and a lower volume limit and adjusting the current volume level setting to maintain the current volume level setting within the upper volume limit and the lower volume limit,
- wherein the setting the value of the current volume level setting according to the method for setting the current volume level setting is paused in response to the land mobile radio operating in a transmit state, and
- wherein the setting the value of the current volume level setting according to the method for setting the current volume level setting is paused in response to a radio speaker of the land mobile radio being activated.

10. The method of claim 9, wherein the setting the value of the current volume level setting according to the method for setting the current volume level setting is paused in response to an activating by a user of a radio button on the land mobile radio and is resumed in response to a completing of the activating.

11. The method of claim 9, further comprising:
- receiving the ambient audio at a microphone of the land mobile radio and generating a microphone signal; and
- receiving the microphone signal at an analog-to-digital converter and generating the processor input signal based on the ambient audio received at the microphone.

12. The method of claim 9, wherein the difference maintained between the value of the current volume level setting and the ambient audio level is equal to the difference between the ambient audio level in a quiet environment and the value of the current volume level setting set by the user in the quiet environment.

13. The method of claim 9, wherein a difference between an output audio volume of the radio speaker and the ambient audio is equal to the difference between the ambient audio level in a quiet environment and the value of the current volume level setting.

14. The method of claim 9, further comprising producing an amplification signal representative of an amplification of the ambient audio.

15. The method of claim 9, wherein the method is repeated continuously.

16. The method of claim 9, wherein the ambient audio level is representative of a volume level of the ambient audio received at a microphone.

17. A method for setting a current volume level setting of a land mobile radio in response to ambient audio, the method comprising:
- receiving a processor input signal based on an ambient audio at a first processor circuitry and determining an ambient audio level based on the ambient audio; and
- setting a value of the current volume level setting of the land mobile radio such that a difference is maintained between the current volume level setting and the ambient audio level as the ambient audio changes in amplitude,
- wherein the setting the value of the current volume level setting further comprises providing an upper volume limit and a lower volume limit and adjusting the current volume level setting to maintain the current volume level setting within the upper volume limit and the lower volume limit, and
- wherein the setting the value of the current volume level setting according to the method for setting the current volume level setting is paused in response to an activation of a transmit state and resumed in response to a completing of the activation of the transmit state.

18. The method of claim 17, wherein the difference maintained between the value of the current volume level setting and the ambient audio level is equal to the difference between the ambient audio level in a quiet environment and the value of the current volume level setting in the quiet environment.

19. The method of claim 17, wherein a difference between the output audio volume of a radio speaker and the ambient audio is equal to the difference between the ambient audio level in a quiet environment and the value of the current volume level setting in the quiet environment.

20. The method of claim 17, wherein the ambient audio level is representative of a volume level of the ambient audio received at a microphone of the land mobile radio.

* * * * *